(12) United States Patent
Leigh et al.

(10) Patent No.: US 6,960,978 B2
(45) Date of Patent: Nov. 1, 2005

(54) FUSE STRUCTURE

(75) Inventors: Stan E. Leigh, Corvallis, OR (US);
Tom P. Abadilla, Corvallis, OR (US);
Donald W. Schulte, Corvallis, OR (US);
Terry McMahon, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/621,484

(22) Filed: Jul. 16, 2003

(65) Prior Publication Data

US 2005/0012587 A1 Jan. 20, 2005

(51) Int. Cl.$^7$ .............................................. H01H 85/10
(52) U.S. Cl. ........................ 337/159; 337/290; 337/295
(58) Field of Search .................................... 337/159, 160, 337/290, 295–297, 416; 29/623; 438/467, 600, 601; 365/225.7; 257/50, 209, 529, 530, E21.592, E23.149, E23.147

(56) References Cited

U.S. PATENT DOCUMENTS

| | | | | |
|---|---|---|---|---|
| 1,441,550 A | * | 1/1923 | Weston ........................ 337/295 |
| 2,682,587 A | * | 6/1954 | Burt et al. ................... 337/232 |
| 3,413,586 A | * | 11/1968 | Salzer ......................... 337/159 |
| 3,417,357 A | * | 12/1968 | Withers ...................... 337/295 |
| 3,524,157 A | * | 8/1970 | Salzer ......................... 337/159 |
| 3,898,603 A | | 8/1975 | Cricchi et al. |
| 3,959,047 A | | 5/1976 | Alberts et al. |
| 4,331,947 A | * | 5/1982 | Noerholm ................... 337/159 |
| 4,349,804 A | * | 9/1982 | Gaia ........................... 337/198 |
| 4,460,914 A | | 7/1984 | Te Velde et al. |
| 4,517,583 A | | 5/1985 | Uchida |
| 4,544,907 A | * | 10/1985 | Takano ....................... 337/262 |
| 4,682,140 A | * | 7/1987 | Diaz-Noriega .............. 337/260 |
| 4,689,598 A | * | 8/1987 | Ishikawa et al. ............ 337/295 |
| 4,751,490 A | * | 6/1988 | Hatagishi .................... 337/295 |
| 5,420,456 A | * | 5/1995 | Galbi et al. ................. 257/529 |
| 5,519,658 A | | 5/1996 | Uda et al. |
| 5,808,351 A | | 9/1998 | Nathan et al. |
| 5,898,357 A | * | 4/1999 | Endo et al. ................. 337/159 |
| 5,976,943 A | | 11/1999 | Manley et al. |
| 6,384,708 B1 | * | 5/2002 | Jollenbeck et al. ......... 337/297 |
| 6,433,404 B1 | * | 8/2002 | Iyer et al. ................... 257/529 |
| 6,542,064 B2 | * | 4/2003 | Endo et al. ................. 337/278 |
| 2002/0060350 A1 | * | 5/2002 | Schulte et al. ............. 257/530 |
| 2002/0086516 A1 | | 7/2002 | Hsu et al. |

FOREIGN PATENT DOCUMENTS

WO PCT/US2005/022233    2/2005

OTHER PUBLICATIONS

Search Report, Feb. 7, 2005, Hewlett Packard.
H. Ceric, et al.; "Electromigration Induced Evolution of Voids in Current Crowding Areas of Interconnects"; 2002 IEEE; Proceedings of 9th IPFA 2002, Singapore; pp. 140–144.

* cited by examiner

Primary Examiner—Anatoly Vortman

(57) ABSTRACT

A fuse structure is described. The fuse structure includes a first region adapted to be coupled to a voltage source, a second region adapted to be coupled to a ground, and a current flow region disposed between the first and second regions. The current flow region has a configuration that causes a void to be opened at a point of localized heating due to current crowding within the current flow region and that causes the void to propagate across the current flow region.

22 Claims, 4 Drawing Sheets

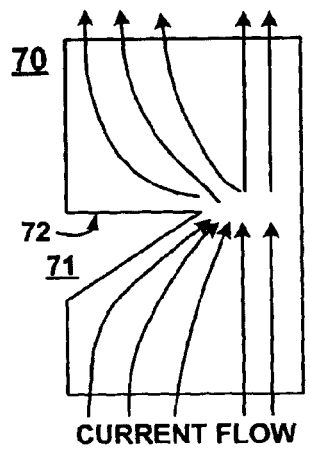
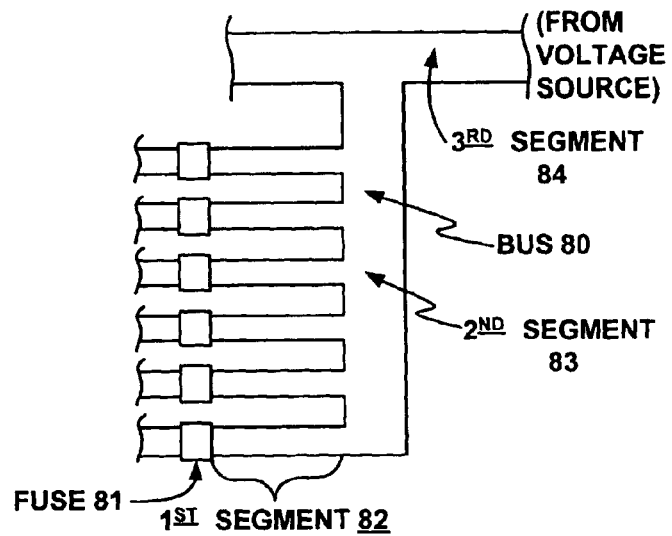
FIG. 7        FIG. 8
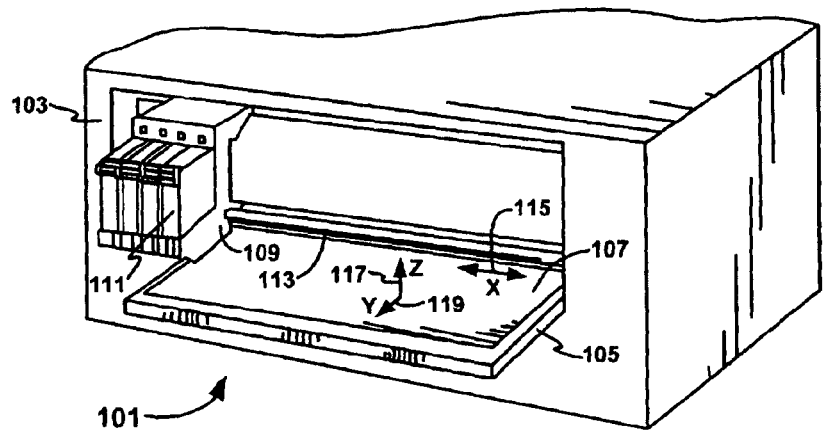
FIG. 9

200

```
GENERATE A CURRENT IN A REGION OF A FUSE
202
            │
            ▼
INDUCE LOCALIZED HEATING AT A POINT IN THE
CURRENT FLOW REGION BECAUSE OF THE
SHAPE OF THE CURRENT FLOW REGION
204
            │
            ▼
OPEN A VOID IN THE CURRENT FLOW REGION
206
            │
            ▼
PROPAGATE THE VOID ACROSS THE CURRENT
FLOW REGION BECAUSE OF THE SHAPE OF THE
CURRENT FLOW REGION
208
            │
            ▼
PROVIDE UNIFORM HEATING AT EACH FUSE BY
USING A POWER BUS THAT DOES NOT SERVE AS
A HEAT SINK FOR THE FUSES
210
```

FIG. 10

FUSE STRUCTURE

BACKGROUND

Fuses, or more specifically micro fuses, can be used to encode (store) information in devices such as removable printer components (e.g., ink cartridges) used in printer systems. For example, a device can include a number of fuses. A blown fuse has a higher, or substantially open-circuit, resistance, while a non-blown fuse has a lower, or substantially closed-circuit, resistance. Information can be encoded depending on which fuses are blown or the particular combination of blown fuses. In a printer system, the type of information encoded may include, for example, identification of the type of product, the amount of ink provided by an ink cartridge, and the value of a thermal sense resistor associated with the ink cartridge.

The fuses may be blown during the manufacturing process or afterwards. Oftentimes there is difficulty in reliably blowing the fuses on a consistent basis. Variability in manufacture can result in some fuses blowing at a given voltage while others will not. This can result in some fuses that are intended to exhibit a substantially open-circuit resistance exhibiting a substantially closed-circuit resistance instead. Fuses can also "under blow," meaning that they are partially but not completely blown. A higher voltage can be used to help ensure that the appropriate fuses will reliably blow. However, too much voltage can cause fuses to "over blow," meaning that they blow too vigorously, perhaps causing damage to other layers of the fuse structure.

Variability in temperature from one fuse to another is another factor that contributes to the difficulty in blowing fuses reliably and consistently.

Not only do the factors described above combine to increase the uncertainty that a fuse can be blown, but they also introduce uncertainty into the fuse-blowing process. For example, it can be more difficult to identify beforehand what voltage should be used to blow the appropriate fuses.

For these and other reasons, there is a need for the present invention.

SUMMARY OF THE INVENTION

Embodiments of the present invention pertain to a fuse structure, to a bus that can be coupled to the fuse structure, and to a combination of these elements. The fuse structure includes a first region adapted to be coupled to a voltage source, a second region adapted to be coupled to a ground, and a current flow region disposed between the first and second regions. The current flow region has a configuration that causes a void to be opened at a point of localized heating due to current crowding within the current flow region and that causes the void to propagate across the current flow region.

BRIEF DESCRIPTION OF THE DRAWINGS

The accompanying drawings, which are incorporated in and form a part of this specification, illustrate embodiments of the invention.

FIG. 7 illustrates another embodiment of a fuse structure in accordance with the present invention.

FIG. 8 illustrates one embodiment of a bus in accordance with the present invention.

FIG. 9 is a perspective diagram of an exemplary printer system in which embodiments of the present invention can be implemented.

FIG. 10 is a flowchart of a process for blowing fuses according to one embodiment of the present invention.

The drawings referred to in this description should be understood as not being drawn to scale except if specifically noted.

DETAILED DESCRIPTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Figure 1:
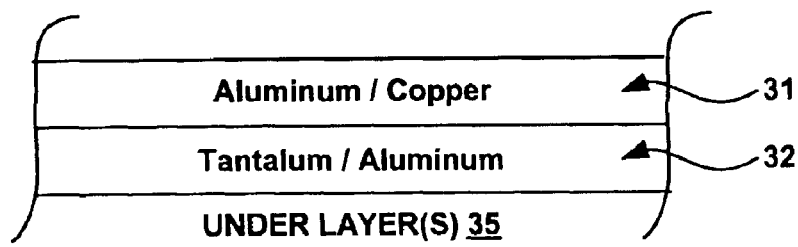
FIG. 1 is a cross-sectional view showing certain layers used in forming a fuse structure according to one embodiment of the present invention.

FIG. 1 is a cross-sectional view showing certain layers in a stack 30 used in forming a fuse structure according to one embodiment of the present invention. More specifically, shown are layers that are used to form a metal-1 layer in a micro fuse according to one embodiment of the present invention. In the present embodiment, the metal-1 layer actually includes a first (conductive) layer 31 and a second (resistive) layer 32. The first layer 31 and the second layer 32 are disposed over an under layer (or layers) 35.

The first layer 31 includes material that has a lower resistance and the second layer 32 includes material that has a higher resistance. In one such embodiment, the first layer 31 is made up of aluminum and copper, and the second layer 32 is made up of tantalum and aluminum. Other materials can be used. For example, the second layer 32 can be made up of materials including, but not limited to, tantalum nitride, polysilicon, hafnium bromide, and metal silicon nitrides such as WSiN (tungsten silicon nitride).

An etch process such as a slope metal etch process, or some other process for selectively removing material, is applied to the metal-1 layer to remove the first layer 31 in the area of the micro fuse (fuse region 36), exposing the second layer 32 when viewed from above. This is illustrated in cross-sectional view by FIG. 2. Other layers (e.g., over layer or layers 34) may also be present.

In the absence of the first layer 31 in the area of the micro fuse, current is caused to flow through second layer 32, the layer of higher resistance. Significantly, as will be seen by the discussion of FIGS. 3, 4, 5, 6 and 7 below, the second layer 32 forms a current flow region particularly configured to cause consistent and reliable blowing of fuses when appropriate.

Figure 3:
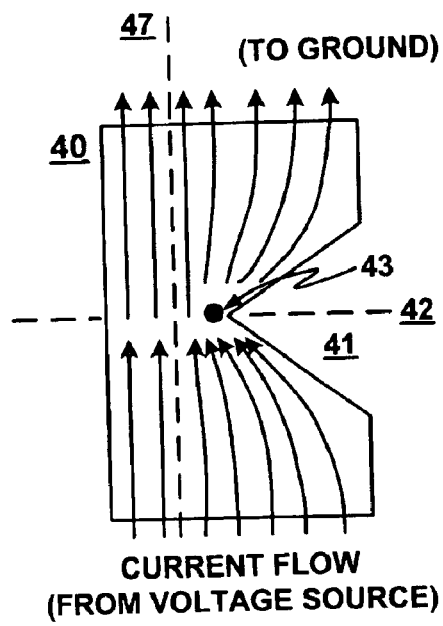
FIG. 3 illustrates an embodiment of a fuse structure in accordance with the present invention.

FIG. 3 illustrates a fuse structure 40 in accordance with one embodiment of the present invention. More specifically, illustrated is the current flow region of a micro fuse. FIG. 3 is a top down view of a metal-1 layer in a stack of layers (the other layers are not depicted). The fuse structure is couplable to a voltage source and to a ground (refer also to the discussion of FIG. 8, below).

Figure 2:
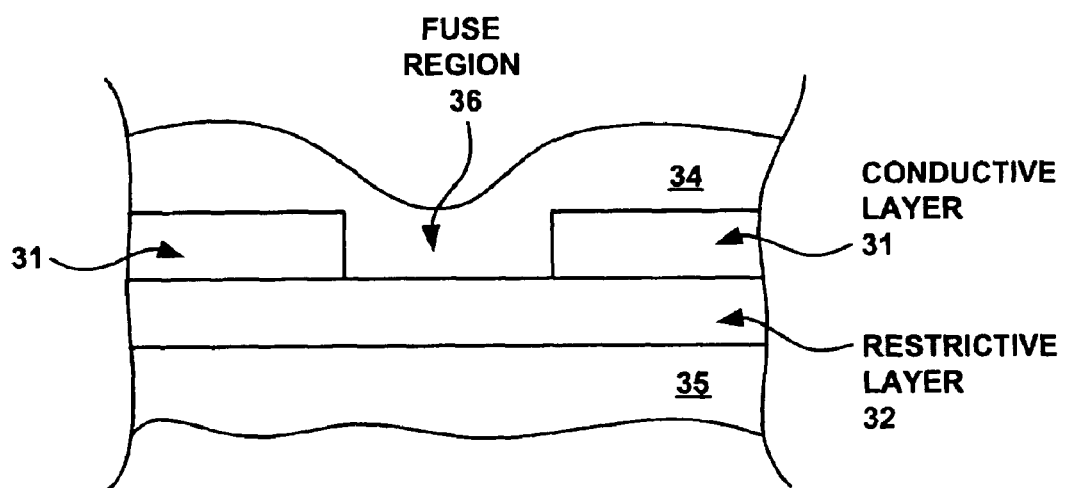
FIG. 2 is a cross-sectional view showing a fuse structure formed according to one embodiment of the present invention.

The current flow region of the fuse structure is in the second (resistive) layer 32 in the fuse region 36 of FIG. 2. The current flow region is asymmetric. That is, the current flow region is asymmetrically shaped about an axis 47 that is essentially parallel to the general direction of current flow from the voltage source to the ground.

In the embodiment of FIG. 3, the current flow region has a configuration that defines a recess 41 that extends into the current flow region from one side of the fuse structure 40. In the top down view of FIG. 3, the recess 41 is shown as appearing on one side of fuse structure 40; however, the recess 41 can instead be on the other side. The recess 41 is substantially symmetrical about an axis 42 that is orthogonal to the general direction of current flow. In the embodiment of FIG. 3, the recess 41 is essentially triangular in shape.

The recess 41 induces current crowding in the narrowed portion of the current flow region formed by the recess 41. Due to the asymmetric configuration of the fuse structure 40, the temperature increase across the narrowed portion of the current flow region will not be uniform. More specifically, the configuration of the current flow region causes localized heating at a point 43. The point 43 will therefore be at a higher temperature than other points located within the narrowed portion of the current flow region. As a result, a void in the resistive layer will form first at point 43.

Accordingly, a consistent initiation point leading to blowing of the fuse is achieved. In general, the point 43 is likely to be located proximate to the point at which recess 43 extends furthest into the current flow region.

Figure 4:
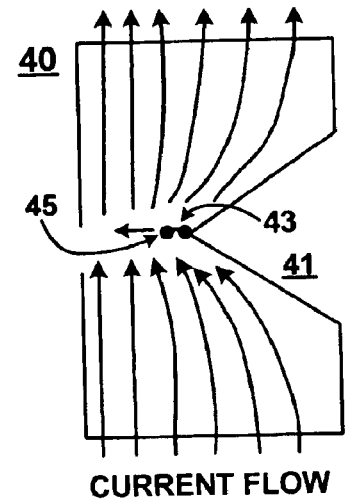
FIG. 4 illustrates a void propagating across the fuse structure of FIG. 3.

FIG. 4 illustrates propagation of a void, opened as described above, across the fuse structure of FIG. 3. With the introduction of a void at point 43, current crowding and the attendant localized heating will move to a point 45 adjacent to the initiation point 43. The void will as a result expand to include point 45. With the void now extending to point 45, current crowding and the attendant localized heating will move further to the left (according to the orientation of FIG. 4). In this manner, the void will continue to propagate across the narrowed portion of the current flow region until it extends all the way across the current flow region, thereby blowing the fuse.

In summary, the asymmetric configuration of the fuse structure causes current crowding, which in turn causes the greatest localized heating at a point that is propagated across the current flow region as the void is propagated across the current flow region. In effect, the configuration of the fuse structure focuses the current crowding at a point. By virtue of this effect, a void in the current flow region can be reliably opened starting at that point and then propagated, and the fuse can therefore be reliably blown. Moreover, lower voltages can be used, meaning that if a fuse should be over blown, the likelihood of damage to surrounding layers is reduced. Also by virtue of this effect, the voltage needed to open and propagate a void can be more reliably predicted.

Figure 5:
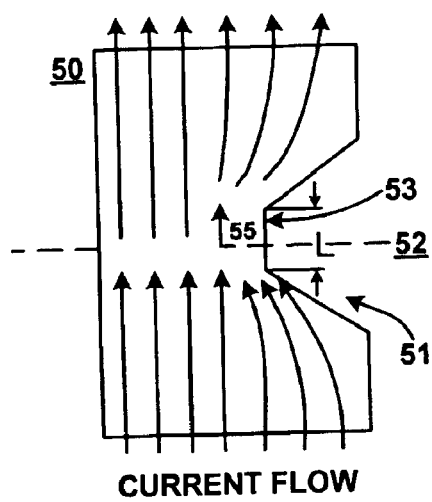
FIG. 5 illustrates another embodiment of a fuse structure in accordance with the present invention.

FIG. 5 illustrates another embodiment of a fuse structure 50 in accordance with the present invention. In this embodiment, the configuration of the current flow region defines a recess 51 that is substantially trapezoidal in shape. The recess 51 is substantially symmetrical about an axis 52 that is orthogonal to the general direction of current flow.

The recess 51 has a "flat" portion 53, rather than coming to a point as in the embodiment of FIGS. 3 and 4. The portion 53 creates a region 55 of consistent resistance within the current flow region of fuse structure 50. The length L of portion 53 can be varied to achieve a desired resistance characteristic.

Figure 6:
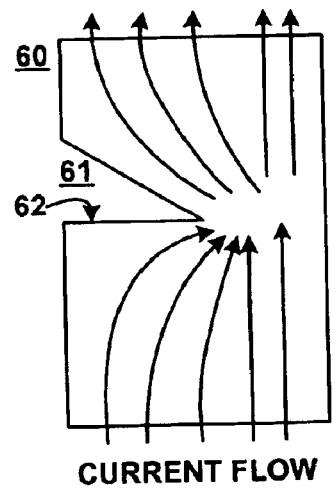
FIG. 6 illustrates another embodiment of a fuse structure in accordance with the present invention.

FIG. 6 illustrates yet another embodiment of a fuse structure 60 in accordance with the present invention. In this embodiment, the configuration of the current flow region defines a recess 61 that has a substantially straight side 62. The straight side 62 is on the side of the recess 61 closest to the source of the current (that is, side 62 is on the upstream side of recess 61).

FIG. 7 illustrates still another embodiment of a fuse structure in accordance with the present invention. In this embodiment, the configuration of the current flow region defines a recess 71 that has a substantially straight side 72. The straight side 72 is on the side of the recess 71 away from the source of the current (that is, side 72 is on the downstream side of recess 71).

In summary, in each of the embodiments described above, a recess is defined that extends into the region of current flow within a fuse. The recess extends from one side of the fuse so that the current flow region is asymmetrically shaped. The extent to which the recess extends into the current flow region is a design parameter. In one embodiment, the recess extends more than about half-way across the current flow region.

Although FIGS. 3–7 describe certain configurations that can be used, it is appreciated that the present invention is not so limited. For example, a chevron-shaped recess can be defined. Recesses of other shapes that induce localized heating that results in initiation of a void in the current flow region can be used. Variation in the general shape of the recess from that described herein is permitted with this aim in mind. It is also appreciated that combinations of the configurations described herein can be used.

FIG. 8 illustrates one embodiment of a bus 80 in accordance with the present invention. In the present embodiment, bus 80 is described as a power bus; however, bus 80 can also be a ground bus.

Bus 80 can be coupled to a plurality of circuit elements. In the present embodiment, bus 80 is coupled to a plurality of circuit elements exemplified by circuit element 81. The bus 80 can be coupled to the circuit elements 81 either directly or via multiplexing circuitry. In one embodiment, the circuit elements are fuses such as those configured according to the embodiments described in conjunction with FIGS. 3–7, although the present invention is not so limited.

Bus 80 of FIG. 8 is coupled to the circuit elements 81 by a plurality of first segments exemplified by segment 82. A second segment 83 is coupled to each of the first segments 82. The first segments 82 couple the second segment 83 to each of the circuit elements 81. The configuration of the bus 80, including the first segments 81 and the second segment 82, can be said to resemble a comb.

In one embodiment, the first segments 82 are approximately equal in length and are substantially parallel to each other, and the second segment 83 is substantially orthogonal to the first segments 82. According to such an embodiment, the second segment 83 is essentially equidistant from each of the circuit elements 81.

The second segment 83 is separated from the circuit elements 81 by a distance defined by the length of the first segments 82. The length of the first segments 82 is a design consideration. The length of the first segments 82 is selected to thermally insulate the circuit elements 81 from the second segment 83. As such, the second segment 83 will not act as a heat sink for the circuit elements. As a consequence, each of the circuit elements 81 is heated to approximately the same degree. The variability in heating of one fuse versus another is thereby removed from the fuse-blowing process, resulting in more consistent and reliable fuse blowing. In another words, using bus 80, each fuse coupled to the bus is subject to essentially the same thermal loads.

Moreover, the second segment 83 is narrow enough to prevent it from acting as a heat sink. In addition, the third segment 84 of the bus 80 is likewise narrow enough to prevent it from acting as a heat sink. Also, the third segment 84 is thermally insulated from the circuit elements 81 by virtue of its distance from those elements, so that this portion of the bus 80 is further prevented from acting as a heat sink. It is recognized that, by narrowing portions of the bus 80, there is a tradeoff between the capacity of the bus to carry current and the capacity of the bus to serve as a heat sink. In other words, the dimensions of the bus 80 can be selected to achieve a desirable balance between the electrical and thermal (e.g., heat sink) characteristics of the bus.

FIG. 9 is a perspective diagram (partial cut-away) of an exemplary printer system 101 upon which embodiments of the present invention can be implemented. Exemplary printer system 101 includes a printer housing 103 having a platen 105 to which input media 107 (e.g., paper) is transported by mechanisms known in the art. Additionally, exemplary printer system 101 includes a carriage 109 holding at least one removable printer component 111 (e.g., a printer cartridge) for ejecting fluid such as ink onto input media 107. Carriage 109 is typically mounted on a slide bar 113 or similar mechanism to allow the carriage 109 to be moved along a scan axis, X, denoted by arrow 115. Also, during typical operation, input media 107 is moved along a feed axis, Y, denoted by arrow 119. Often, media 107 travels along the feed axis, Y, while ink is ejected along an ink drop trajectory axis, Z, as shown by arrow 117. Exemplary printer system 101 is also well suited to use with replaceable printer components such as semi-permanent printhead mechanisms having at least one small volume, on-board, ink chamber that is sporadically replenished from fluidically-coupled, off-axis, ink reservoirs or replaceable printer components having two or more colors of ink available within the replaceable printer components and ink ejecting nozzles specifically designated for each color. Exemplary printer system 101 is also well suited to use with replaceable printer components of various other types and structures. Although such an exemplary printer system 101 is shown in FIG. 9, embodiments of the present invention are well suited to use with various other types of printer systems. Embodiments of the present invention can also be utilized in systems other than printer systems.

The fuse design and/or the bus design described above can be used during the manufacturing process of the printer system, including each of its various components, or after the manufacturing process. The fuses can be used to store information on the printer system including any of its components, such as the ink cartridge, for example.

FIG. 10 is a flowchart 200 of a process for blowing fuses according to one embodiment of the present invention. Although specific steps are disclosed in flowchart 200, such steps are exemplary. That is, embodiments of the present invention are well suited to performing various other steps or variations of the steps recited in the flowchart. It is appreciated that the steps in the flowchart may be performed in an order different than presented, and that not all of the steps in the flowchart may be performed.

In step 202, a current is generated in a current flow region of a fuse coupled to a power bus.

In step 204, localized heating is induced at a point in the current flow region because of the shape of that region. More specifically, the current flow region has a configuration that causes current crowding at a point in the current flow region. Various embodiments of a configuration that can cause current crowding and localized heating are described above in conjunction with FIGS. 3–7.

In step 206 of FIG. 10, a void is opened in the current flow region, specifically at the point of current crowding and localized heating mentioned in step 204.

In step 208, the void is propagated across the current flow region because of the shape of that region. Eventually, the void can propagate entirely across the current flow region, blowing the fuse.

In step 210, when there are several fuses coupled to the power bus, the fuses are each subjected to substantially the same thermal loads because the bus is configured and dimensioned so that the bus does not serve as a heat sink for the fuses.

In summary, embodiments of the present invention allow fuses to be blown on a consistent and reliable basis, reducing or eliminating instances in which fuses are over blown or under blown. With the improved reliability, variability in fuse-blowing processes can be reduced. For example, with fuse blowing more reliably predicted to occur, an acceptable applied voltage range can be defined with confidence that voltages in that range will result in the appropriate fuses being blown on a consistent basis.

The foregoing descriptions of specific embodiments of the present invention have been presented for purposes of illustration and description. They are not intended to be exhaustive or to limit the invention to the precise forms disclosed, and many modifications and variations may be possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A fuse structure comprising:
   a laminate comprising a first layer and a second layer, said first layer having a lower electrical resistance than said second layer, wherein said second layer comprises:
   a first region adapted to be coupled to a voltage source;
   a second region adapted to be coupled to a ground; and
   a current flow region disposed between said first and second regions, wherein said current flow region is uncurved between said first and second regions and wherein said current flow region defines a recess in the plane of said second layer, said recess extending, from one side of said current flow region into said current flow region wherein said recess extends more than approximately halfway across said current flow region.

2. The fuse structure of claim 1 wherein said recess is substantially symmetrical in shape about an axis that is essentially orthogonal to the direction of current flow.

3. The fuse structure of claim 1 wherein said recess is substantially triangular in shape.

4. The fuse structure of claim 1 wherein said recess is substantially trapezoidal in shape.

5. The fuse structure of claim 1 wherein said recess defines a substantially straight edge extending essentially orthogonally into said current flow region, wherein said edge faces toward the direction of current flow.

6. The fuse structure of claim 1 wherein said recess defines a substantially straight edge extending essentially orthogonally into said current flow region, wherein said edge faces away from the direction of current flow.

7. The fuse structure of claim 1 wherein said fuse structure is one of a plurality of fuse structures, wherein information is encoded by said fuse structures according to which ones of said fuse structures are blown.

8. A fuse structure comprising:
   a laminate comprising a first layer and a second layer, said first layer having a lower electrical resistance than said second layer, wherein a gap in said first layer separates a first part of said first layer from a second part of said layer, said gap bridged by said second layer so that current flowing in said first part is directed into said second layer, and wherein said second layer comprises:
a first region adapted to be coupled to a voltage source;
a second region adapted to be coupled to a ground; and
a current flow region disposed between said first and second regions, said current flow region having a configuration that defines a recess in the plane of said second layer extending from a first side of said current flow region into said current flow region, wherein a second side of said current flow region defines a substantially straight edge.

9. The fuse structure of claim 8 wherein said recess extends more than approximately halfway across said current flow region.

10. The fuse structure of claim 8 wherein said recess is substantially symmetrical in shape about an axis that is essentially orthogonal to the direction of current flow.

11. The fuse structure of claim 8 wherein said recess is substantially triangular in shape.

12. The fuse structure of claim 8 wherein said recess is substantially trapezoidal in shape.

13. The fuse structure of claim 8 wherein said recess defines a substantially straight edge extending essentially orthogonally into said current flow region, wherein said edge faces toward the direction of current flow.

14. The fuse structure of claim 8 wherein said recess defines a substantially straight edge extending essentially orthogonally into said current flow region, wherein said edge faces away from the direction of current flow.

15. A method of blowing a fuse, said method comprising:
providing a current through a current flow region of said fuse, said fuse comprising a laminate comprising a first layer and a second layer, wherein said second layer comprises said current flow region, said current flow region having a configuration that defines a recess in the plane of said second layer extending from a first side of said current flow region into said current flow region, wherein a second side of said current flow region defines a substantially straight edge that is parallel to the direction of current flow;
forming a void at a point within said current flow region due to localized heating at said point; and
propagating said void across said current flow region to blow said fuse.

16. The method of claim 15 wherein said recess extends more than approximately halfway across said current flow region.

17. The method of claim 15 wherein said recess is substantially symmetrical in shape about an axis that is essentially orthogonal to the direction of current flow.

18. The method of claim 15 wherein said recess defines a substantially straight edge extending essentially orthogonally into said current flow region.

19. A fuse structure comprising:
a laminate comprising a first layer and a second layer, said first layer having a lower electrical resistance than said second layer, wherein said second layer comprises:
a first region adapted to be coupled to a voltage source;
a second region adapted to be coupled to a ground; and
a current flow region disposed between said first and second regions, wherein said current flow region is uncurved between said first and second regions and wherein said current flow region defines a recess in the plane of said second layer, said recess extending from one side of said current flow region into said current flow region, wherein said recess is substantially triangular in shape.

20. A fuse structure comprising:
a laminate comprising a first layer and a second layer, said first layer having a lower electrical resistance than said second layer, wherein said second layer comprises:
a first region adapted to be coupled to a voltage source;
a second region adapted to be coupled to a ground; and
a current flow region disposed between said first and second regions, wherein said current flow region is uncurved between said first and second regions and wherein said current flow region defines a recess in the plane of said second layer, said recess extending from one side of said current flow region into said current flow region, wherein said recess is substantially trapezoidal in shape.

21. A fuse structure comprising:
a laminate comprising a first layer and a second layer, said first layer having a lower electrical resistance than said second layer, wherein said second layer comprises:
a first region adapted to be coupled to a voltage source;
a second region adapted to be coupled to a ground; and
a current flow region disposed between said first and second regions, wherein said current flow region is uncurved between said first and second regions and wherein said current flow region defines a recess in the plane of said second layer, said recess extending from one side of said current flow region into said current flow region, wherein said recess defines a substantially straight edge extending essentially orthogonally into said current flow region, wherein said edge faces toward the direction of current flow.

22. A fuse structure comprising:
a laminate comprising a first layer and a second layer, said first layer having a lower electrical resistance than said second layer, wherein said second layer comprises:
a first region adapted to be coupled to a voltage source;
a second region adapted to be coupled to a ground; and
a current flow region disposed between said first and second regions, wherein said current flow region is uncurved between said first and second regions and wherein said current flow region defines a recess in the plane of said second layer, said recess extending from one side of said current flow region into said current flow region, wherein said recess defines a substantially straight edge extending essentially orthogonally into said current flow region, wherein said edge faces away from the direction of current flow.

* * * * *

UNITED STATES PATENT AND TRADEMARK OFFICE
CERTIFICATE OF CORRECTION

PATENT NO. : 6,960,978 B2  Page 1 of 1
APPLICATION NO. : 10/621484
DATED : November 1, 2005
INVENTOR(S) : Stan E. Leigh et al.

It is certified that error appears in the above-identified patent and that said Letters Patent is hereby corrected as shown below:

In column 6, line 42, in Claim 1, delete "extending," and insert -- extending --, therefor.

In column 6, line 44, in Claim 1, delete "region" and insert -- region, --, therefor.

Signed and Sealed this

Eleventh Day of August, 2009

David J. Kappos
*Director of the United States Patent and Trademark Office*